United States Patent [19]
Jost et al.

[11] 4,170,498
[45] Oct. 9, 1979

[54] TRANSDUCER

[75] Inventors: Ernest M. Jost, Plainville; Arthur L. Reenstra, Attleboro, both of Mass.; George Trenkler, East Providence, R.I.

[73] Assignee: Texas Instruments Incorporated, Dallas, Tex.

[21] Appl. No.: 870,169

[22] Filed: Jan. 17, 1978

Related U.S. Application Data

[62] Division of Ser. No. 637,482, Dec. 3, 1975, Pat. No. 4,068,527, which is a division of Ser. No. 427,943, Dec. 26, 1973, Pat. No. 3,940,992.

[51] Int. Cl.² .......................... H04R 15/00; H01L 41/20; H01L 41/22
[52] U.S. Cl. .................................. 148/121; 73/722; 73/753; 148/12 R; 148/122
[58] Field of Search ................ 73/722, 753; 148/121, 148/12 R, 122

[56] References Cited

U.S. PATENT DOCUMENTS

| 1,586,883 | 6/1926 | Elmen | 148/121 |
|---|---|---|---|
| 1,673,790 | 6/1928 | Bandur | 148/121 |
| 1,739,752 | 12/1929 | Elmen | 148/121 |
| 2,376,156 | 5/1945 | Kuehni | 73/722 |
| 2,414,457 | 1/1947 | Eldredge et al. | 73/753 |
| 3,162,795 | 12/1964 | Cherniak | 73/722 |
| 3,183,126 | 5/1965 | Curtis et al. | 148/121 |

*Primary Examiner*—W. Stallard
*Attorney, Agent, or Firm*—John A. Haug; James P. McAndrews

[57] ABSTRACT

A magnetostrictive pressure transducer is disclosed wherein pressure in the range of zero to 1000 psi can be accurately measured. The pressure transducer apparatus includes a diaphragm causing the pressure to be applied unidirectionally on sensor material having the property of undergoing changes in magnetic induction when a pressure is applied thereto, the change in magnetic induction being related to the applied pressure. The change in magnetic induction is measured and thus provides a measurement of the applied pressure. Several embodiments are also disclosed for measuring vacuum. In these embodiments force is also applied unidirectionally on the sensor material.

11 Claims, 9 Drawing Figures

TRANSDUCER

This is a division of application Ser. No. 637,482, filed Dec. 3, 1975, now U.S. Pat. No. 4,068,527 which in turn is a division of application Ser. No. 427,943 filed Dec. 26, 1973 now U.S. Pat. No. 3,940,992.

The disclosure herein includes subject matter disclosed in patent application Ser. No. 428,485, filed Dec. 26, 1973, now U.S. Pat. No. 4,011,756.

This invention relates to a magnetostrictive pressure transducer and, more specifically, to a device for measuring relatively low pressures, wherein the force from the pressure being sensed is directed along one axis of an element having the property of changing magnetic induction proportionally to the force applied thereto and means for measuring the changes in the magnetic induction as a quantitative indication of the force and hence the applied pressure.

It is well known that the magnetic properties of many ferromagnetic materials undergo changes with stress. For example, the magnetic induction of nickel-iron alloys and iron-cobalt alloys increases and that of nickel decreases with tension stress. Conversely, if these metals are subjected to magnetic fields, their volume will increase in the case of nickel-iron and iron-cobalt alloys or contract in the case of nickel. This expansion may be as large as $70 \times 10^{-6}$ in/in for 60 cobalt-iron (H-450 amp-turn/M) alloy. Some attempts have been made to utilize the above described magnetostrictive principle for pressure sensing purposes. U.S. Pat. No. 2,370,845 is an example of prior art which uses magnetostrictive sensors to measure stresses in the 1000 psi+ region.

The prior art as well as initial logical attempts to provide a transducer for measuring low pressure is not satisfactory for relatively low pressures in that at hydrostatic pressure levels below 200 psi the output voltage obtained is low and zero levels are erratic. Such systems have a low output/noise ratio. In accordance with the present invention, there is provided a pressure transducer which overcomes the above noted problems. Briefly, the above is accomplished by providing a diaphragm for applying pressure to be measured along an axis of a magnetostrictive element and providing circuitry for sensing the changes in magnetic induction of the magnetostrictive element.

It is therefore an object of this invention to provide a magnetostrictive pressure transducer capable of measuring relatively low pressure levels accurately.

It is a further object of this invention to provide a magnetostrictive pressure transducer which is a small size relative to prior art transducers.

It is a yet further object of this invention to provide a magnetostrictive pressure transducer which is substantially insensitive to ambient temperature.

It is a yet further object of this invention to provide a magnetostrictive pressure sensing device wherein pressure is directed along one axis of the magnetostrictive device.

The above objects and still further objects of the invention will become apparent from the following description of preferred embodiments of the invention which are provided by way of example and not by way of limitation, wherein.

Figure 1:
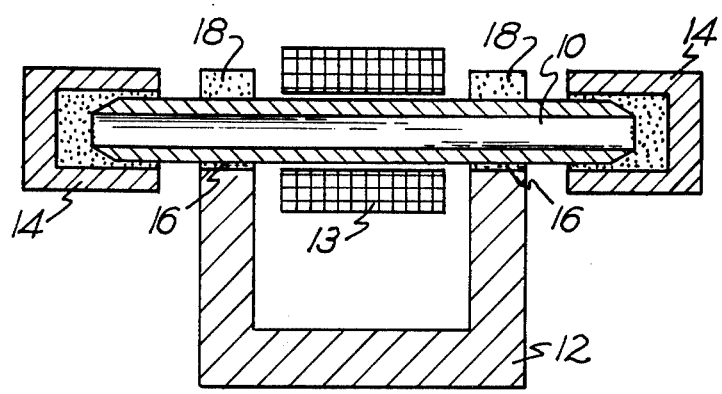
FIG. 1 is a cross section of a pressure sensing member or cartridge in accordance with the present invention.

Referring first to FIG. 1, there is shown a pressure sensing cartridge for sensing of applied pressure in accordance with the present invention. The cartridge includes a magnetostrictive stud 10 made of material having magnetic properties. The stud is preferably composed of iron-cobalt alloys, nickel-iron alloys or ferrites. In particular alloys of iron-cobalt have been found to be effective since such alloys have a level of permeability which optimizes the output to noise ratio of the system and also since such alloys have magnetic properties which are less temperature dependent than other known magnetic materials. To minimize the volume required for the electronics (required for energizing the cartridge and detecting the output signal) and to optimize the frequency response of the pressure transducer, relatively high excitation frequencies are required. At higher frequencies the reactive components of the electronics decrease in volume. However the depth of penetration (skin depth) of the magnetic field decreases with frequency so that smaller cross-sectional areas of the magnetostrictive stud are active in influencing the electrical circuit. The skin depth depends on the electrical resistivity and the magnetic permeability of the material. For instance, for a frequency of 1000 Hz and average magnetic material, the skin depth is less than 10 mils. Thus in the preferred embodiment the sensor element is made in a tubular configuration as by rolling one end of a sheet toward a second end but spaced therefrom. The spacing may be maintained by placing a nonmagnetic core of plaster if desired. The sheet may also be rolled upon itself in the form of a scroll to increase the active surface area without a significant increase in volume. The tube or scroll is configured by taking a thin sheet, for instance between 0.0005 and 0.01 inches in thickness, of iron-cobalt alloy, coating opposite sides with a thin layer of insulating material such as for example a polyimide synthetic resin, such as sold by E.I. DuPont DeNemours and Company under the trademark "KAPTON." This sheet is then rolled into a tube or on itself into a relatively tight scroll.

A sensor made in accordance with the invention may be constructed by taking a sheet of iron-cobalt alloy, (PERMENDUR a trademark of Allegheny Ludlum Steel Corp. for cobalt-iron alloys of very high magnetic saturation) 0.002 inches thick annealing it in an inert atmosphere such as argon at a temperature range from 840° to 860° C., preferably at 850° C., for one to two hours and then quenching it in brine. The sheet is cut and coated with $0.2 \times 10^{-3}$ inches thick layer of polyimide on opposite faces of the sheet. The polyimide is composed of pyromelletic dianhydride, polyamide acid and M-pyrol (vehicle) and is precured at 150° C. for twenty minutes to remove the vehicle, and rolled into a tube or a scroll if desired with an outer diameter of approximately 0.125 inches. Retaining rings may be placed about the scrolls to keep them tightly wound while the tubes or scrolls are heat treated first to react the pyromelletic dianhydride and the polyamide acid at 220 to 260° C. for one hour to obtain the polyimide and then to develop the magnetic properties of the alloy material. This heat treatment consists of baking the tubes or scrolls from 1 to 60 hours at 250° to 350° C., preferably for fifty hours at 300° C. This configuration not only gives good mechanical stability but it also results in a sensor which has excellent sensitivity in the desired pressure range of 0-100 psi through use of a diaphragm exerting 2-5 Kg/mm$^2$ on the sensor with essentially a straight line output versus force relationship. The ends of the scrolls may have a conical shape which can conveniently be produced by cutting the sheet into a trapezoidal shape prior to rolling. The conical shape produces a uniform stress per area of material and prevents the possibility of excessive eddy currents through short circuits. Pressure to be sensed is applied along the longitudinal axis of the magnetostrictive stud 10 and is coupled to it through end pieces 4 and diaphragm 26. The diaphragm may be dome shaped formed of material 0.004 inches thick and having a spring rate less than 0.5 lb/0.001 inches. This low spring rate can be achieved by forming two concentric corrugations (not shown) in the diaphragm which also compensates for differences in temperature expansion between the sensing stud and the mount for the sensing stud. It should be noted that other axially directed force transmitting means could be used in place of the diaphragm if desired, such as other membranes, a piston or the like. The end pieces are of bronze or brass and are attached by means of a hydrostatic pressure transfer medium such as potting compounds having high strength, good chemical resistance and good performance at high temperatures such as an epoxy novolac resin. A coil 13 is centrally located about stud 10. The free portions of stud 10 between the end pieces and coil 13 are inserted in respective slots 16 of "U" shaped yoke 12 formed of ferrite material. Slots 16 may be formed so that stud 10 fits closely therein with little or no air gap. For convenience of manufacture a slight space between the stud and the yoke can be provided and then filled with ferrite powder 18 suspended in a binder such as paste or vacuum grease or some thermoplastic or elastic epoxy such as "FLEXANT" 95 a trademark of Devcon Corporation, Danvers, Mass. for a non sagging urethane putty. Alternatively yoke 12 of magnetic material could be molded so that the legs of the yoke are molded about spaced portions of the stud.

Figure 2:
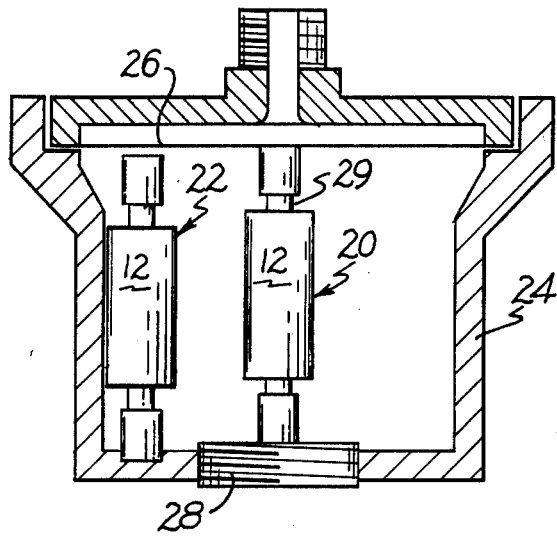
FIG. 2 is a cross section of a transducer assembly mounting two pressure sensing members of FIG. 1 in accordance with the present invention.

A pair of sensors of the type in FIG. 1 may be utilized in an electronic transducer circuit (to be explained later). The pair of transducers, as shown in FIG. 2, is positioned in a case 24; the transducers comprising a sensing transducer 20 and a reference transducer 22. The sensing transducer 20 is mounted so that an end cap 14 contacts a membrane 26. A calibration device 28 is provided in the form of a mount screw so that adjustment of the screw will determine the initial force of the stud 10 in cartridge 20. Electronic circuitry may be positioned within or without case 24.

Figure 3:
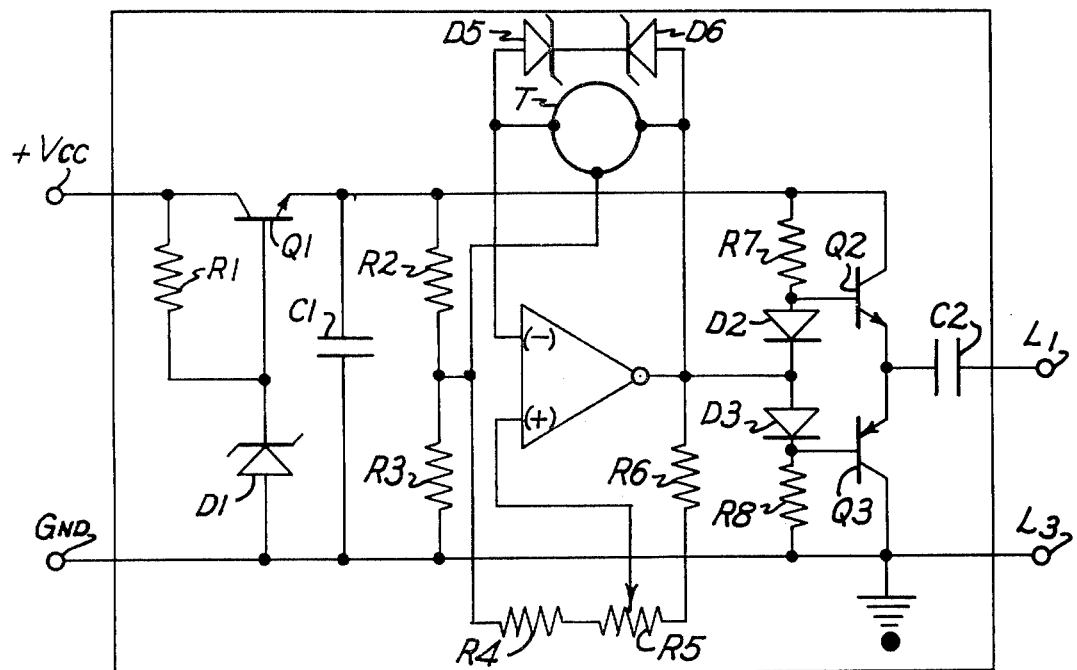
FIG. 3 is an excitation circuit for use with the assembly of FIG. 2.

An excitation voltage is applied to the sensor by as excitation oscillator circuit 30 such as that shown in FIG. 3 which can for example provide up to three volts peak to peak at one kilohertz. The excitation circuit includes a voltage regulated power supply comprising NPN transistor Q1, zener diode D1, capacitor C1 and resistor R1 and an oscillator comprising twin T filter T limited by back to back zener diodes D5, D6 connected between the negative input and the output of an operational amplifier. Positive feedback to the amplifier is provided through a voltage divider comprising resistors R4, R5 and R6. Resistor R5 is a variable resistor to permit adjustment of the amount of feedback. An auxiliary circuit for providing the proper voltage level for the operational amplifier comprises a voltage divider including resistors R2 and R3. A buffer and amplifier portion comprises a temperature compensated voltage divider to provide pre bias for output transistors including resistor R7, diode D2 for NPN transistor Q2 and resistor R8, diode D3 for PNP transistor Q3 with capacitor C2 to provide DC isolation. The above circuit is well known in the art and hence operation of it will not be described in detail.

Figure 4:
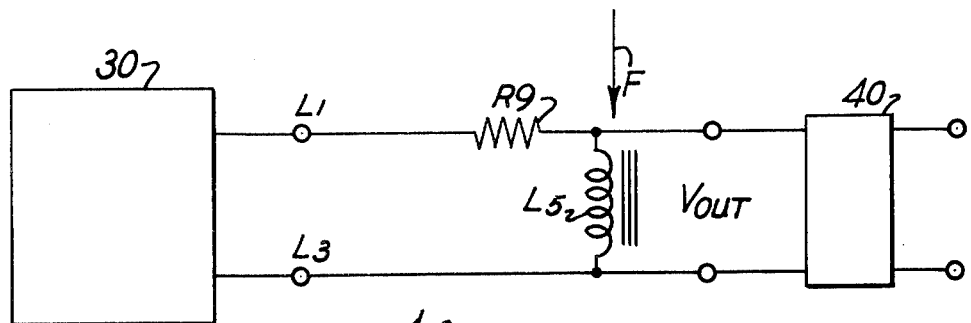
FIGS. 4-6 are circuit embodiments employing pressure sensing members of FIG. 1.

Referring now to FIG. 4 the excitation output (line L1) is applied across a voltage divider comprising resistor R9 and coil L5 providing an output voltage at junction A. Coil L5 corresponds to transducer 20 of FIG. 2 with the axial force to be measured indicated by arrow F. Resistor R9 can be temperature sensitive to provide ambient compensation to offset any temperature sensitivity of transducer 20. For instance temperature sensitive material such as nickel or nickel-silicon alloy wire or negative temperature coefficient (NTC) thermistors can be used for the resistor. Alternatively, temperature compensation can be obtained by constructing the magnetic coil itself with temperature sensitive wire. Thus a change in force F causes a change in the inductance of coil L5 and a corresponding change in the output voltage at junction A. This output voltage is fed to a signal recovery circuit or detector, well known in the art. It is desirable that the detector provide a high impedance load on the sensor such that changes in voltage be detected with high impedance amplifier to minimize error. As shown in FIG. 4 an asymmetrical detector 40 is employed. Any suitable indicating means (not shown) can then be connected to detector 40.

Figure 5:
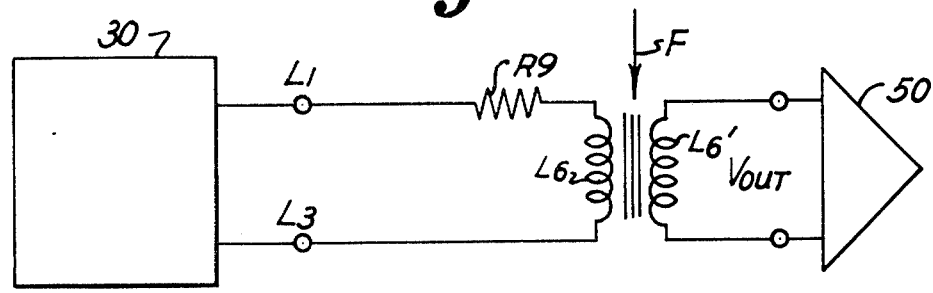

In FIG. 5 an extra coil L6' is provided on stud 10 to recover the output. This embodiment is particularly useful if electrical isolation between the excitation circuit and sensor and the detector is desired. This embodiment is also useful for obtaining a symmetrical output and hence useful with differential amplifier 50 shown in the Figure. It will be noted the FIG. 4 embodiment changes in inductance only are detected while in the FIG. 5 embodiment changes in magnetic coupling due to stress between the primary and secondary coils are detected along with changes in inductance.

Figure 6:
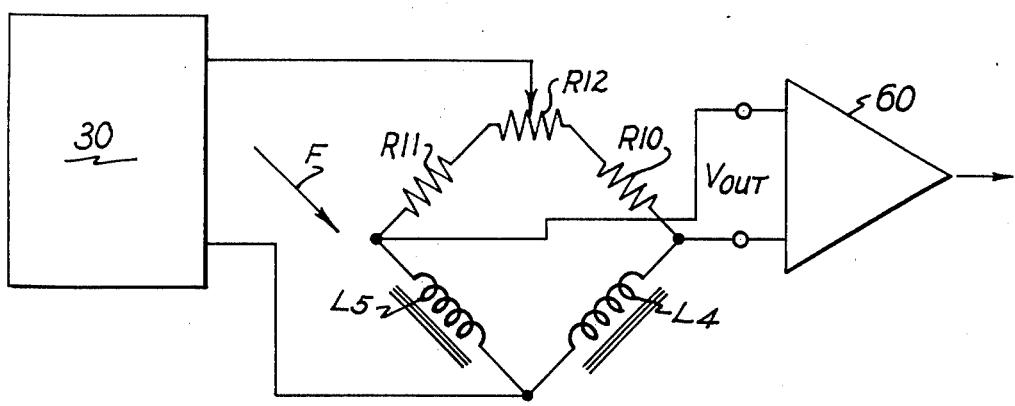

FIG. 6 shows yet another embodiment similar to FIGS. 4 and 5. In the embodiment a sensing bridge is employed comprising coil L4 (corresponding to transducer 22 of FIG. 2) and resistor R10 in one leg of the bridge and coil L5 (corresponding to transducer 20 of FIG. 2) and resistor R11 in the other leg of the bridge. Resistors R10 and R11 may be temperature dependent for the same reason as mentioned above relative to resistor R9 in FIGS. 4 and 5. Variable resistor R12 can be used to provide correction for zero output. The detector circuit comprises differential amplifier 60 with symmetrical or asymmetrical output as desired. Thus any output from the sensing bridge due to bridge imbalance is amplified to provide an output voltage which is proportional to the force applied to the transducer 20 (coil L5).

Figure 7:
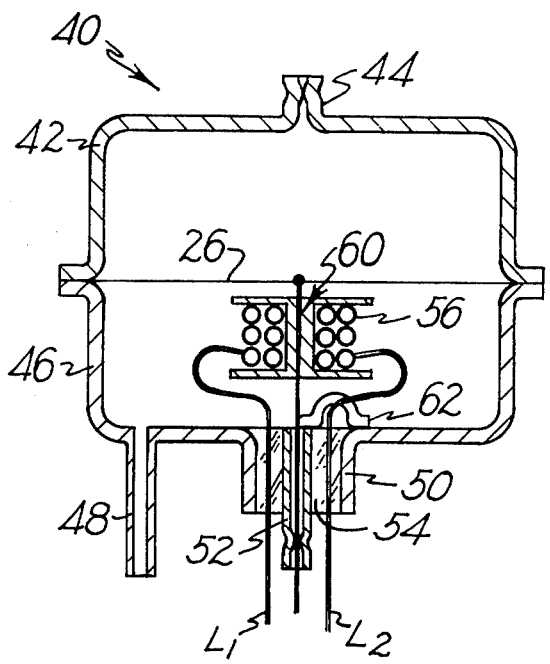
FIG. 7 is a cross section of a transducer assembly mounting a pressure sensing member particularly suitable for measuring vacuum.

Now referring to FIG. 7 there is shown an assembly 40 particularly useful in measuring vacuum. Assembly 40 includes a first casing half 42 having an evacuation tube 44 and a diaphragm 26 as shown in the FIG. 2 embodiment, however, in this case formed of magnetic material. A second casing half 46 mates with casing half 42 and is provided with a suction tube 48 and header 50. Lines L1 and L2 and tube 52 pass through header 50 and are maintained in spaced apart relation by glass 54. Lines L1, L2 are connected to coil 56 mounted within casing half 46. A sensor wire 60 formed of magnetic material such as iron-cobalt alloys is attached to diaphragm 26 as by welding and extends through tube 52. Casing half 46 is composed of magnetic material to serve as a yoke which along with magnetic linkage completes a magnetic circuit with wire 60 and diaphragm 26.

Casing halfs 42 and 46 and diaphragm 26 are hermetically attached to one another. Casing half 42 is evacuated through tube 44 and the tube sealed to form a reference chamber. Tension is applied to sensor wire 60 to calibrate the assembly and then tube 52 is sealed. Suction tube 48 is attached to the medium to be measured. Excitation and detection can be accomplished by employing the circuit of FIGS. 3–6 supra.

Figure 8:
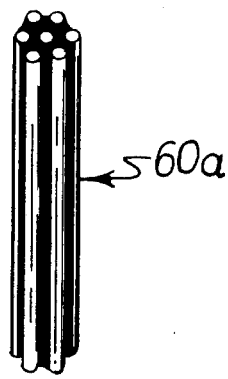
FIG. 8 is a perspective of a portion of a sensing member useful in the FIG. 7 assembly.
Figure 9:
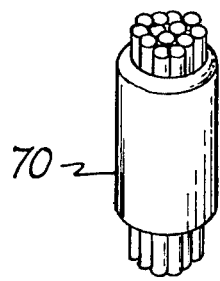
FIG. 9 is a view similar to FIG. 8 showing the sensing member in a retaining means.

Sensor wire 60 may comprise a single strand of magnetic material or a bundle of wires as indicated at 60a in FIG. 8. The separate strands of the bundle are insulated from one another as by embedding a suitable potting compound such as an epoxy resin, silicone or other plastics. If desired a retaining sleeve 70 made out of a non-magnetic material, FIG. 9, may be used to maintain the strands of the bundle in position.

Although the invention has been described with respect to specific preferred embodiments any variations and modifications will immediately become apparent to those skilled in the art. It is therefore the intention that the appended claims be interpreted as broadly as possible in view of the prior art to include all such variations and modifications.

What is claimed is:

1. A method of making a magnetostrictive sensing element comprising the steps of taking a sheet of magnetic material, annealing the sheet to render it malleable, cutting the sheet in a traepzoidal configuration, rolling the sheet upon itself to form a scroll from one parallel end to another parallel end so that upon rolling the scroll will have conical ends and heat treating the sheet to optimize its magnetic properties.

2. A method according to claim 1 in which the material is selected from the group consisting of iron-cobalt alloys, nickel-iron alloys and ferrites.

3. A method according to claim 1 in which the material is an iron-cobalt alloy and the sheet is between 0.0005 and 0.01 inches in thickness.

4. A method according to claim 1 in which the heat treating step includes baking between 250° and 350° C. for 1 to 100 hours.

5. A method according to claim 4 in which the heat treating step includes baking at approximately 300° C. for approximately fifty hours.

6. A method of making a magnetostrictive sensing element comprising the steps of taking a sheet of cobalt-iron alloy, annealing the sheet at a temperature in the range of approximately 840° to 860° C. to render it malleable, providing the sheet with insulating material, rolling the sheet from a first end to a second end into a tubular configuration in which the first end is spaced from the second end and heat treating the sheet including baking the sheet at a temperature in the range of approximately 250° to 350° C. for 1 to 100 hours to optimize its magnetic properties.

7. A method according to claim 6 in which the sheet is rolled upon itself to form a scroll.

8. A method according to claim 7 including the step prior to rolling of cutting the sheet in a trapezoidal configuration so that upon rolling the scroll will having conical ends.

9. A method according to claim 6 in which the sheet is between 0.0005 and 0.01 inches in thickness.

10. A method according to claim 6 in which the heat treating step includes baking at approximately 300° C. for approximately fifty hours.

11. A method according to claim 6 in which the insulating material is polyimide.

* * * * *